United States Patent
Schnerr et al.

(10) Patent No.: US 9,308,821 B2
(45) Date of Patent: Apr. 12, 2016

(54) INTERNAL POWER SUPPLY CONTROL DEVICE HAVING AT LEAST ONE LIGHTING CONTROL DEVICE FOR A MOTOR VEHICLE

(75) Inventors: Michael Schnerr, Stuttgart (DE); Dirk Blum, Tuebingen (DE)

(73) Assignee: AUTOMOTIVE LIGHTING REUTLINGEN GMBH, Reutlingen (DE)

( * ) Notice: Subject to any disclaimer, the term of this patent is extended or adjusted under 35 U.S.C. 154(b) by 8 days.

(21) Appl. No.: 13/879,895

(22) PCT Filed: Oct. 17, 2011

(86) PCT No.: PCT/EP2011/068094
§ 371 (c)(1),
(2), (4) Date: Jul. 23, 2013

(87) PCT Pub. No.: WO2012/055718
PCT Pub. Date: May 3, 2012

(65) Prior Publication Data
US 2013/0304304 A1    Nov. 14, 2013

(30) Foreign Application Priority Data

Oct. 26, 2010 (DE) .......................... 10 2010 049 716

(51) Int. Cl.
*B60Q 11/00* (2006.01)
*B60L 1/16* (2006.01)
(Continued)

(52) U.S. Cl.
CPC ................ *B60L 1/16* (2013.01); *B60Q 11/005* (2013.01); *B60R 16/0232* (2013.01);
(Continued)

(58) Field of Classification Search
CPC ........... H05B 33/0824; H05B 33/0875; H05B 33/0881; H05B 33/0884; H05B 33/089; H05B 33/0893; H05B 37/034; H05B 37/038; B60Q 11/005; B60Q 11/007

USPC ................................................ 701/29.2, 34.4
See application file for complete search history.

(56) References Cited

U.S. PATENT DOCUMENTS 6,490,512 B1 * 12/2002 Niggemann ................. 701/29.1
6,963,177 B2 * 11/2005 Ito et al. ....................... 315/291
(Continued)

FOREIGN PATENT DOCUMENTS

DE        4431190 A1 *  3/1996  ............... B60Q 1/50
DE        19618010 C1    7/1997
(Continued)

OTHER PUBLICATIONS

JPO machine translation of JP 2010-62327 (original JP document published Mar. 18, 2010).*

(Continued)

*Primary Examiner* — Behrang Badii
*Assistant Examiner* — David Testardi
(74) *Attorney, Agent, or Firm* — Howard & Howard Attorneys PLLC

(57) ABSTRACT

A combination (10) of a power-supply control device (12) and at least one light-control device (14) of a motor vehicle operates at least one semiconductor light source (36, 38). The control device (12) supplies the light-control device (14) with power via a supply line (18) connected to a first connection pin (20) of the control device (12), monitors current flowing through connection pins of the control device (12), and makes use of diagnoses thereof. The light-control device (14) is connected to an additional connection pin (28) of the control device (12) via an error line (26) and checks function of the connected semiconductor light source (36, 38) and, in the case of a malfunction, triggers a current flow in the error line (26). The control device (12) reacts to the triggered current flow with generation of an error message.

11 Claims, 2 Drawing Sheets

(51) Int. Cl.
  *H05B 33/08* (2006.01)
  *B60R 16/023* (2006.01)
  *H05B 37/03* (2006.01)
  *G01R 31/26* (2014.01)
  *G01R 31/44* (2006.01)

(52) U.S. Cl.
  CPC ....... *B60R 16/0238* (2013.01); *G01R 31/2607* (2013.01); *G01R 31/44* (2013.01); *H05B 33/0881* (2013.01); *H05B 33/0887* (2013.01); *H05B 33/0893* (2013.01); *H05B 37/034* (2013.01)

(56) References Cited

U.S. PATENT DOCUMENTS

| | | | |
|---|---|---|---|
| 7,274,150 B2 * | 9/2007 | Takeda et al. | 315/77 |
| 7,294,968 B2 * | 11/2007 | Ito et al. | 315/82 |
| 7,301,447 B2 * | 11/2007 | Patel | 340/475 |
| 7,333,027 B2 * | 2/2008 | Bourgault | 340/907 |
| 7,646,028 B2 * | 1/2010 | Russell et al. | 257/80 |
| 8,035,606 B2 * | 10/2011 | Liao et al. | 345/102 |
| 8,344,661 B2 * | 1/2013 | Hsu et al. | 315/307 |
| 8,354,799 B2 * | 1/2013 | Yang et al. | 315/247 |
| 2003/0226954 A1 | 12/2003 | Ohmi | |
| 2005/0140315 A1 * | 6/2005 | Baldwin et al. | 315/308 |
| 2005/0200287 A1 | 9/2005 | Ito et al. | |
| 2006/0061303 A1 | 3/2006 | Takeda et al. | |
| 2006/0231745 A1 * | 10/2006 | Bodano et al. | 250/214 R |
| 2006/0232394 A1 | 10/2006 | Patel | |
| 2007/0159118 A1 | 7/2007 | Kajita et al. | |
| 2007/0236155 A1 * | 10/2007 | Kao et al. | 315/247 |
| 2009/0295776 A1 * | 12/2009 | Yu et al. | 345/212 |
| 2012/0105228 A1 * | 5/2012 | Loveland et al. | 340/540 |

FOREIGN PATENT DOCUMENTS

| | | | | |
|---|---|---|---|---|
| DE | 10107578 A1 * | 8/2002 | | B60Q 11/00 |
| DE | 10215486 C1 * | 10/2003 | | H05B 37/03 |
| DE | 10345422 A1 | 4/2004 | | |
| DE | 10346528 A1 | 4/2004 | | |
| DE | 102004045435 A1 | 3/2006 | | |
| DE | 102006015053 A1 | 10/2006 | | |
| DE | 102008047731 A1 * | 3/2010 | | H05B 33/08 |
| DE | 102008062639 A1 * | 6/2010 | | B60Q 1/14 |
| DE | 102008062642 A1 * | 6/2010 | | B60Q 1/26 |
| DE | 102009019752 A1 | 11/2010 | | |
| EP | 1843639 A1 * | 10/2007 | | H05B 33/08 |
| EP | 2096898 A1 | 9/2009 | | |
| EP | 2247161 A1 * | 11/2010 | | H05B 33/08 |
| GB | 2 434 929 A | 8/2007 | | |
| JP | 2008081048 A * | 4/2008 | | |
| JP | 2010062327 A * | 3/2010 | | |
| WO | WO 2009100762 A1 * | 8/2009 | | H05B 37/02 |

OTHER PUBLICATIONS

EPO machine translation of EP 2247161 (original EP document published Nov. 3, 2010).*
Continental press release, "LED light control units from Continental", Aug. 11, 2009, 3 pages, (Exhibit A) downloaded from http://www.continental-corporation.com/www/pressportal_com_en/themes/press_releases/3_automotive_group/interior/press_releases/pr_2009_08_11_led_light_control_en.html.*
Wikipedia article, "Body control module", last modified May 14, 2014, 1 page, (Exhibit B).*
Notice of Opposition Filed on Dec. 16, 2015 in European Application No. 11772946.7. (in French with no translation).
Communication of a Notice of Opposition—First Information to Patent Proprietor issued by the European Patent Office on Jan. 5, 2016 in European Application No. 11772946.7. (in German with no translation).
Communication of a Notice of Opposition and Request to File Observations issued by the European Patent Office on Jan. 26, 2016 in European Application No. 11772946.7. (in German with no translation).
Brief Communication—Opposition Proceedings issued by the European Patent Office on Jan. 27, 2016 in European Application No. 11772946.7. (in German with no translation).

* cited by examiner

INTERNAL POWER SUPPLY CONTROL DEVICE HAVING AT LEAST ONE LIGHTING CONTROL DEVICE FOR A MOTOR VEHICLE

CROSS-REFERENCE TO RELATED APPLICATIONS

This is a national stage application of International Patent Application PCT/EP2011/068094 filed on Oct. 17, 2011, which, in turn, is based, upon and claims priority to German Patent Application 10 2010 049 716.9 filed on Oct. 26, 2010.

BACKGROUND OF INVENTION

1. Field of Invention

The present invention relates to, in general, a combination of a power-supply control device and at least one light-control device equipped to operate at least one semiconductor light source and, in particular, such a combination on-board a motor vehicle.

2. Description of Related Art

A combination of this type is known per se, wherein the power-supply control device is equipped for supplying the lighting control with power via a supply line connected to a first connection pin of the power-supply control device and to monitor currents flowing through the connection pin of the power-supply control device and make use of diagnoses of the appliance connected to the respective connection pin.

A power-supply control device can be understood to be a power-distribution center in a motor vehicle and is designed to control appliances in the motor vehicle—such as, for example, a central locking system, a sunroof, and light sources of the motor vehicle—and monitor their functions.

Power-supply control devices are mass-produced articles, which should be capable of being implemented in the broadest range possible and, therefore, also fulfill their function in connection with appliances the properties of which differ from one to another. Examples of appliances having differing properties are to be found in light sources, which, for example, can be implemented in the form of incandescent lamps, gas-discharge lamps, or semiconductor light sources. Regardless of whether a motor vehicle is equipped with, for example, semiconductor light sources or with incandescent lamps, it should be possible in both cases to use the same power-supply control device.

Incandescent lamps such as halogen lamps and semiconductor light sources differ in the manner by which they are activated. Incandescent lamps such as halogen lamps are operated using a continuously flowing operating current of approx. 4-5 A. In contrast, for the operation of semiconductor light sources, such as those used in motor vehicles, a significantly lower operating current of, for example, 50-1.00 mA is sufficient. Furthermore, semiconductor light sources are frequently operated with a pulse-width-modulated current instead of a continuously flowing current.

Difficulties in the monitoring thereof occur from the specified differences in the activation of such lamps. The connection pins for conventional power-supply control devices each exhibits a high-side actuator (i.e., an actuator connected at an input end to a supply potential) equipped for connecting and/or disengaging an appliance lying at the output connection to or from a supply potential.

For the monitoring of the current flowing through the high-side actuator of a connection pin, the known power-supply control device exhibits, in particular, an ""open load" detection" function. In an "open load" state, no power flows through the high-end actuator, which may, for example, be the case with a defective appliance. To detect such a state, the power-supply control device checks whether the operating current flowing through a specific connection pin is less than a threshold value of, for example, 100 mA.

Because incandescent lamps such as halogen lamps are operated with a continuously flowing operating current of approx. 4-5 A, a threshold value of this type enables the power-supply control device to securely differentiate between defective and functioning incandescent lamps.

This does not, however, apply to semiconductor light sources because their normal operating current of, for example, 50-100 mA is already much closer to this threshold value. It is also problematic that semiconductor light sources are frequently operated with a pulse-width-modulated current instead of a continuously flowing current. For the pure control function, a pulse-width-modulated current of this type could consist of current breaks and phases of an amperage deviating from zero, wherein the amperage lies above the specified threshold value.

In the current break, the amperage may be equal to zero or so close to zero that it is at least less than the specified threshold value. When the power-supply control device then maps the pulse-width-modulated signal during a current break, the lower amperage of the current break could be easily interpreted as an error because low values of this type also occur, for example, during a power failure.

To prevent the power-supply control device from generating inaccurate error messages of this type, until now, it has been known to provide light-control devices equipped for the operation of semiconductor light sources coupled to the power-supply control device with amperages that are unnecessarily large for the operation of the semiconductor light sources. One has supplied light-control devices of this type by the power-supply control device with a current, for example, the amperage of which is so high (even during the current breaks of the "PWM" signal) that the power-monitoring function of the power-supply control device does not register any falling below of the threshold value.

A minimum amperage of this type lies, for example, at a value of 200 mA. As has already been mentioned, however, it is possible that only 50-100 mA are necessary for the operation of a semiconductor light source (in particular, a light-emitting diode). The excess power resulting from the difference occurring thereby is converted to heat by circuitry measures in the light-control device. In addition, the amperage not needed by the semiconductor light source during the current breaks is diverted to a supplementary load, such as an ohmic resistor, within the light-control device. Expressed heuristically, one has persuaded the power-supply control device that an incandescent lamp is being operated.

This approach has disadvantages in the form of an unnecessarily high power consumption. From the necessity of having to discharge larger quantities of heat as well, there is the additional disadvantage that numerous heat-sink volumes and surfaces are required than would be needed with a more energy-efficient system. The higher degree of energy efficiency provided by the semiconductor light source is, thereby, at least in part sacrificed.

With this background, an object of the invention consists of providing a combination of a power-supply control device and at least one light-control device of the type specified above that does not exhibit the disadvantages specified or exhibits them to a significantly reduced degree.

SUMMARY OF INVENTION

The invention overcomes the disadvantages in the related art in a combination of a power-supply control device and at least one light-control device of a motor vehicle operates at least one semiconductor light source. The control device supplies the light-control device with power via a supply line connected to a first connection pin of the control device, monitors current flowing through connection pins of the control device, and makes use of diagnoses thereof. The light-control device is connected to an additional connection pin of the control device via an error line and checks function of the connected semiconductor light source and, in the case of a malfunction, triggers a current flow in the error line. The control device reacts to the triggered current flow with generation of an error message.

The invention is distinguished, accordingly, in that the light-control device is additionally connected to an additional connection pin of the power-supply control device via an error line and equipped for checking the function of the connected semiconductor light source and, in the event of a malfunction, to activate a current flow in the error line, wherein the power-supply control device is equipped to react to the activated current flow with the generation of an error message.

The monitoring of the light source, which occurs solely by the power-supply control device in the case of an incandescent light as the light source, is distributed to the light-control device and power-supply control device with the invention. The actual error detection is obtained by the light-control device. The invention enables a power-saving transmission of an error message from the affected light-control device to the power-supply control device in which, in any case, existing hardware structures (specifically, standard connection pins with their internal circuitry) of the power-supply control device are used for the evaluation and interpretation of the error message.

By this, power-supply control devices, identical in terms of their hardware and differing only in terms of software, are suitable for both the operation of incandescent lamps as well as far an energy-efficient operation of semiconductor light sources.

In contrast to the related art specified above with which, during normal operation of the semiconductor light sources, a portion of the current flowing through the allocated connection pin of the power-supply control device must be converted via a supplementary load to heat, the invention enables an operation of the semiconductor light source with which only the current that is actually required for the operation of the semiconductor light source flows through the connection pin allocated to the power-supply control device. A supplementary load is not necessary. In the case of a malfunction, only a comparably lower current flows through the connection pin of the error line.

In this manner, an operation and a monitoring of the semiconductor light source through the use of the normal monitoring of the current flow through the connection pin of the power-supply control device are possible. For this, there is no need to alter the hardware in the known power-supply control devices. All that is needed is an additional connection pin of the power-supply control device to be allocated to each light-control device. This, however, is not problematic because conventional power-supply control devices exhibit a sufficient number of unused connection pins and are, furthermore, equipped for monitoring the current flows through these connection pins.

As a result, the necessary electrical supplementary loads previously used in light-control devices by which prior excess electric energy is converted to heat can be eliminated. Thus, the previously necessary supplementary structures for the dissipation of excess heat can also be eliminated. In this manner, installation space and weight, which were previously necessary for accommodating the larger cooling structures, can be eliminated. An unnecessary current flow amounting to the aforementioned 200 mA generates an electrical power of 3.2 W in a typical motor-vehicle power supply of 16 V, which must be converted to heat in the related art. Through the elimination of this heat, the invention enables the possibility of replacing a heat-conducting metal housing of the light-control device with a lighter and less expensive plastic housing. By this, the production costs can also be reduced.

Other objects, features, and advantages of the invention are readily appreciated as they become more understood while the subsequent detailed description of at least one embodiment of the invention is read taken in conjunction with the accompanying drawing thereof.

BRIEF DESCRIPTION OF EACH FIGURE OF DRAWING OF INVENTION

DETAILED DESCRIPTION OF EMBODIMENTS OF INVENTION

Figure 1:
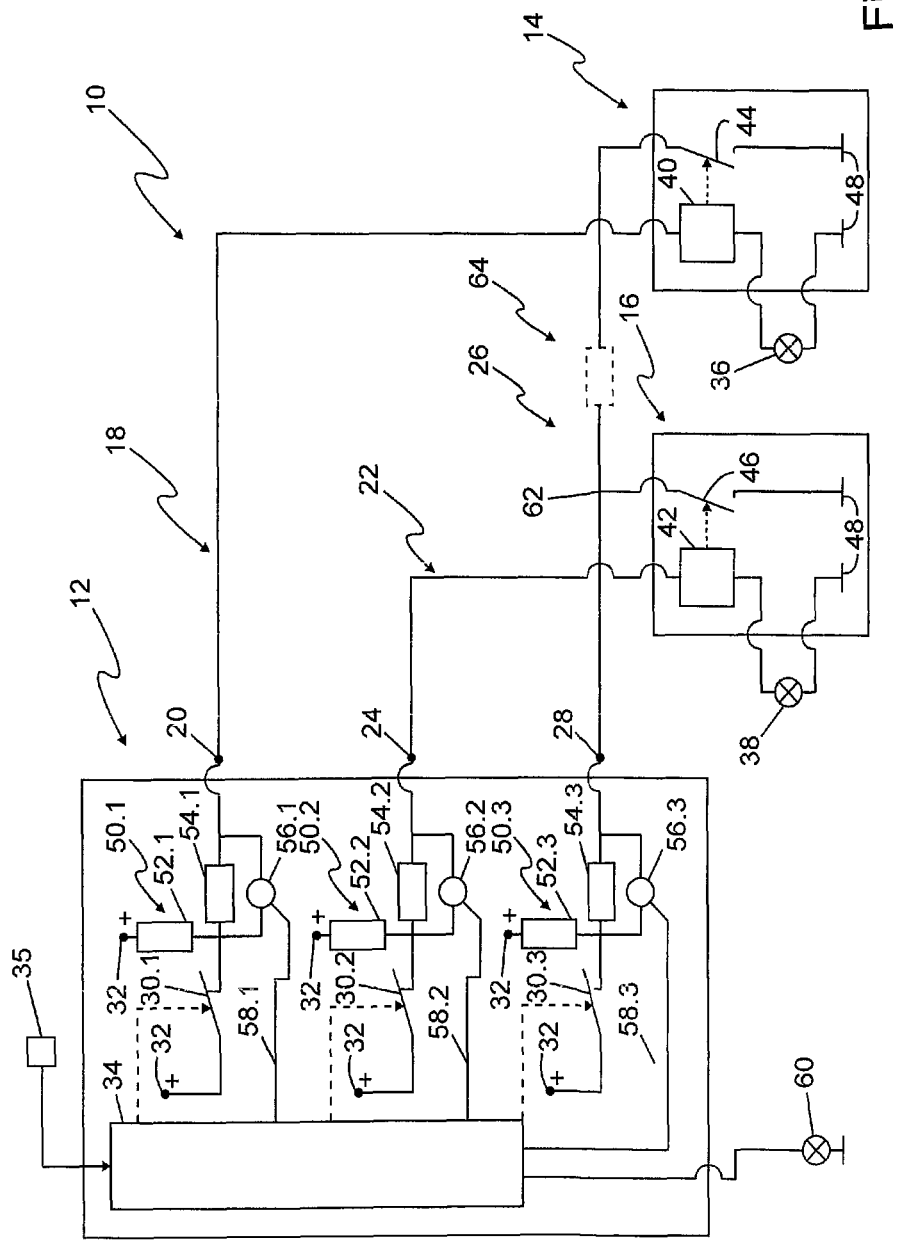
FIG. 1 shows in schematic form a first embodiment of the invention.

Identical reference symbols in the figures indicate, in each case, identical elements or elements with identical functions. In detail, FIG. 1 shows a combination of a power-supply control device 12 of a motor vehicle, a first light-control device 14, and a second light-control device 16. The power-supply control device 12 and the appliance and/or control devices connected thereto are, in general, disposed in various locations in the motor vehicle and connected to one another via lines. The first light-control device 14 is connected to a first connection pin 20 of the power-supply control device 12 via a first supply line 18. The second light-control device 16 is connected to a second connection pin 24 of the power-supply control device 12 via a second supply line 22. Furthermore, both light-control devices 14, 16 are connected to a third connection pin 28 of the power-supply control device 12 via a shared error line 26.

The connection pins 20, 24, 28 are connected to an internal supply-potential connection 32 of the power-supply control device 12 by separate switches for each connection pin 20, 24, 28. The power-supply voltage of the motor vehicle, for example, is applied to the supply-potential connection 32 when the ignition is activated. The first connection pin 20 is connected by a first switch 30.1 to the supply-potential connection 32, the second connection pin 24 is connected by a second switch 30.2, and the third connection pin 28 is connected by a third switch 30.3 to the supply-potential connection 32. Based on the connection with the supply-potential connection 32, the switches 30.1, 30.2, 30.3 are so-called "high-side switches."

The switches 30.1, 30.2, 30.3 are controlled by a control circuitry 34. The control circuitry 34, in an embodiment, exhibits a microprocessor and memory for this and controls the switches 30.1, 30.2, 30.3 by executing a program stored in the memory. The program execution is controlled, in particular, by control commands supplied externally. The commands are represented in FIG. 1 by a light switch 35 the actuation of which by a driver of the motor vehicle activates an "on" signal, which is transmitted by the light switch 35 to the control circuitry 34. The control circuitry 34 is equipped (in particular, programmed) to then control the switches 30.1, 30.2, 30.3 in such a manner that the light-control devices 14, 16 connected thereto are supplied with power.

In the embodiment depicted in FIG. 1, each light-control device 14, 16 controls at least one semiconductor light source 36, 38. Each semiconductor light source 36, 38 consists, in one embodiment, of one or more light-emitting diodes. For the control of the semiconductor light sources 36, 38, each light-control device 14, 16 exhibits a safeguarding and monitoring circuitry 40, 42. Each safeguarding and monitoring circuitry 40, 42 is equipped, in particular, to detect malfunctions of the respective connected semiconductor light source 36, 38 and/or ensure a temperature safeguard, an electromagnetic compatibility, and/or protection against polarity reversal.

Furthermore, the safeguarding and monitoring circuitry 40 is equipped to engage a normally disengaged switch 44 upon detecting a malfunction by which the error line 26 is connected with an engaged switch to a ground connection 48. Analogously, the safeguarding and monitoring circuitry 42 is equipped to engage a normally disengaged switch 46 Upon detection of a malfunction by which the error line 26 is connected with an engaged switch 46 to a ground connection 48.

A typical malfunction is, for example, a short-circuit of a connected semiconductor light source 36, 38, a line break, or an overheating of the connected semiconductor light source 36, 38.

By engaging the switch 44 of the first light-control device 14 and/or switch 46 of the second light-control device 16, the third connection pin 28 (to which the shared error line 26 is connected) is connected with a low resistance to the ground 48, wherein the connection was previously of a high resistance. This change in state is detected with an ""open load" detection" function of the power-supply control device 12, which is known per se. To detect an "open load" state, connections of the high-side switches 30.1, 30.2, 30.3 having the respective allocated connection pins 20, 24, 28 are each equipped with "open load" detection circuitry.

A first "open load" detection circuitry 50.1 of the first connection pin 20 exhibits a pull-up resistor 52.1, precision resistor 54.1, and voltmeter 56.1. The pull-up resistor 52.1 is connected together with the precision resistor 54.1 in series between the supply potential connection 32 and first connection pin 20. In this manner, the pull-up resistor 52.1 is connected to the supply-potential connection 32. A center tap of the series connection leads to the first switch 30.1. The voltmeter 56.1 is connected in parallel to the precision resistor 54.1 and equipped for transmitting measured voltages by a line 58.1 to the control circuitry 34.

The second connection pin 24 exhibits a second "open load" detection circuitry 50.2. The third connection pin 28 exhibits a third "open load" detection circuitry 50.3. The second "open load" detection circuitry 50.2 and third "open load" detection circuitry 50.3 are constructed exactly like the first "open load" detection circuitry 50.1.

As such, the second "open load" detection circuitry 50.2 exhibits a pull-up resistor 52.2, precision resistor 54.2, and voltmeter 56.2 with a line 58.2 to the control circuitry 34. Analogously, the third "open load" detection circuitry 50.3 exhibits a pull-up resistor 52.3, precision resistor 54.3, and voltmeter 56.3 with a line 58.3 to the control circuitry 34.

For an explanation of the typical "open load" detection, it shall first be assumed in the following that an incandescent lamp is connected to the first connection pin 20. An incandescent lamp of this type has a comparably low resistance when in the functioning state. It is of a low resistance. When the switch 30.1 is engaged, a current then flows. If the filament is burned out, however, the lamp has a high resistance. It is of a high resistance and does not allow a current to flow. In this case, the first connection pin 20 would not be supplied with a current even if the first switch 30.1 is engaged and, thus, in an "open load" state.

The detection of an "open load" state, therefore, has the same significance as the detection of a high-resistance connection of the first connection pin 20 to the ground 48, which is the case with an incandescent lamp connected to the first connection pin 20 (in particular, when the element is burned out). The detection of an "open load" state is, therefore, in this context of the same significance as the detection of a malfunction.

To distinguish a functioning state from a malfunction, the control circuitry 34 disengages the first switch 30. The power-supply voltage is applied to the supply-potential connection 32. With a low-resistance incandescent lamp, a current then flows through the pull-up resistor 52.1, precision resistor 54.1, and incandescent lamp, which is connected to the first connection pin 20 in accordance with the conditions assumed above. The voltmeter 56.1 then detects the voltage drop by the precision resistor 54.1 and transmits the voltage drop for assessment to the control circuitry 34. A comparably greater voltage drop is obtained with a low-resistance incandescent lamp and, therefore, results in a comparably greater current flow. If the incandescent lamp is burned out, then there is, in contrast thereto, no current flow through the precision resistor 54.1 and, thus, no voltage drop either at the precision resistor 54.1. This "open load" state is evaluated as a malfunction by the known control circuitry 34.

With the known combination of a power-supply control device and light-control device, enough current is drawn from the associated connection pin of the power-supply control device by an appropriately equipped light-control device that the described "open load" detection, which is based on a monitoring of the current flow in the supply line, does not occur.

In contrast thereto, the detection of a malfunction by the invention depicted herein is no longer based on a monitoring of the current flow in the supply line. The invention is further distinguished in that the light-control device 14, 16 is additionally connected to an additional connection pin of the power-supply control device 12 via an error line 26 and equipped for checking the function of the semiconductor light source 36, 38 connected thereto and, in the case of a malfunction, to send a current flow through the error line 26. Furthermore, the power-supply control device 12 is equipped to react to the current flow sent thereto with the generation of an error message.

In the following, it is assumed that both semiconductor light sources 36, 28 are functioning. In this case, the safeguarding and monitoring circuitries 40, 42 keep the switches 44, 46 disengaged. No current flows through the pull-up resistor 52.3, precision resistor 54.3, and error line 26. The already described "open load" detection then detects an "open load" state at the connection pin 28. In differing from the known power-supply control device, the power-supply control device 12 of the combination according to the invention, comprising one power-supply control device 12 and at least one light-control device 14, 16, is equipped to detect the "open load" state at the connection pin 28 of the error line 26 (not as an error, but, instead, to regard this as a functioning state).

The detection of an error and the signaling thereof occurs with the invention by the at least one light-control device 14, 16 working in conjunction with the power-supply control device 12. For this, the known error detection, based on a monitoring of the current in the supply line, is deactivated in the power-supply control device 12. The actual determination that an error has occurred takes place by the safeguarding and monitoring circuitry 40, 42.

In the following, it shall first be assumed that a malfunction of the semiconductor light source 36 has occurred and been determined by the safeguarding and monitoring circuitry 40 of the first light-control device 14. The safeguarding and monitoring circuitry is equipped to engage the switch 44 in this case of a malfunction. The switch 44 is, in one embodiment, an open-collector circuitry of a bipolar transistor or, in another embodiment, an open-drain circuitry of a field-effect transistor. In this case, the standard "open load" detection for the connection pin 28 is used to signal this malfunction by a relatively low current to the power-supply control device 12.

For this, the high-side switch 30.3 allocated to the connection pin 28 in the power-supply control device 12 is permanently disengaged. It is not used in the invention and only depicted because it belongs to the internal standard wiring of a standard connection pin 28 of the power-supply control device 12.

Before the malfunction occurs and the safeguarding and monitoring circuitry 40 of the first light-control device 14 has engaged the switch 44, the standard "open load" detection executed by the power-supply control device 12 for the connection pin 28 has detected an "open load" state of the connection pin 28 for the error line 26.

In differing from the related art, this "open load" state is not, however, interpreted by the power-supply control device 12 of the combination according to the invention as a malfunction. The engagement of the switch 44 terminates the "open load" state because it enables a current flow through the pull-up resistor 52.3, precision resistor 54.3, error line 26, and engaged switch 44 after the ground 48. The voltage drop generated by this current at the precision resistor 54.3 is detected by the voltmeter 56.3 and supplied to the control circuitry 34 of the power-supply control device 12.

The power-supply control device 12 is equipped (in particular, programmed) to evaluate this voltage drop as a malfunction of an appliance connected to the shared error line 26 and issue and/or store a corresponding error signal. The issuing can occur, for example, by the activation of an error lamp 60 or a display on a screen of a motor-vehicle infotainment system located in the visual field of the driver of the motor vehicle. Alternatively or in addition thereto, the error message is stored in a readable memory for later use by a mechanic.

In the embodiment depicted in FIG. 1, two light-control devices 14, 16 are connected to a shared error line 26. Through the use of the "open-load detection" function for the connection pin 28, a signal can be provided to the power-supply control device 12 indicating that one or both of the control devices 14, 16 is defective.

To enable a distinction of this type, another embodiment provides that the control circuitry 34 shuts off the light-control devices 14, 16 connected to a shared supply line 26, successively, for a short period of time.

The shutting-off of the first light-control device 14 is obtained in that the control circuitry 34 disengages the first high-side switch 30.1. The first light-control device 14 is equipped to disengage the switch 44 when in the "shut off" state or maintain the switch in the disengaged setting. If the described "open load" detection of the connection pin 28 then reacts to an engagement of the switch 30.1 in the supply line 18 for the first light-control device 14 such that the "open load" detection again determines an "open load" state, then this means that the light-control device 14 is the defective control device.

If the "open load" detection for the connection pin 28 does not react, in contrast, to a disengaging of the first high-side switch 30.1, then the switch is again engaged, and the first electronic control unit 14 is again activated. It is then established that the first electronic control unit 14 is not the defective control device.

If only two light-control devices 14, 16 (or, more generally, two appliances) are present, which are connected to the same error line 26, then it is already clear that the second appliance is malfunctioning. If more than two light-control devices 14, 16 (or, more generally, if more than two appliances) are connected to a shared error line 26, then the appliances are shut off successively one at a time and again activated until the detective control device (or malfunctioning appliance) is identified.

Another embodiment provides that, no matter what, all appliances are successively switched off and again activated such that, in each case, only one single appliance is switched off at a time to detect such malfunctioning states in which more than one appliance is malfunctioning. The power-supply control device 12 is equipped (in particular, programmed) to store or display an error message characterizing the particular malfunctioning state after the identification of the defective appliance or appliances, wherein the display thereof can occur, for example, on a screen of a motor-vehicle infotainment system.

Another embodiment is based on the fact that, with a malfunction of the first light-control device 14, a current flow is generated between the supply-potential connection 32 of the third "open load" detection circuitry 50.3 and the ground connection 48 of the first light-control device 14 while, with a malfunction of the second light-control device 16, a current flow is produced between the supply-potential connection 32 and ground connection 48 of the second light-control device 16. This means, particularly, that the current path existing between connection 62 of the second light-control device 16 at the shared error line 26 and the ground connection 48 of the first light-control device 14 only conducts a current when the switch 44 is engaged (i.e., when the first light-control device 14 malfunctions).

An optional existing additional resistor 64 disposed between the connection 62 and ground connection 48 of the first light-control device 14 then lies in series with the pull-up resistor 52.3 and ground resistor 54.3 and results in an additional current-limiting function. As a result, with a malfunction of the first light-control device 14, a lesser current flows to the shared error line 26 than with a malfunction of the second light-control device 16.

These different currents trigger different voltage drops via the precision resistor 54.3 and enable the control circuitry 34 to create a direct allocation of a voltage detected by the voltmeter 56.3 to a malfunction of the first light-control device 14 or second light-control device 16.

Alternatively, an additional resistor 64 of this type could also lie between the connection 62 of the second light-control device 16 at the shared error line and the ground connection 48 of the second light-control device 16. Decisive for the distinction is only that the resistance of the current path lying between the ground connection 48 of the first light-control device 14 and the connection 62 of the second light-control device 16 has a different value than the resistance of the current path lying between the ground connection 48 of the second light-control device 16 and the connection 62 of the second light-control device 16 at the shared error line 26.

Figure 2:
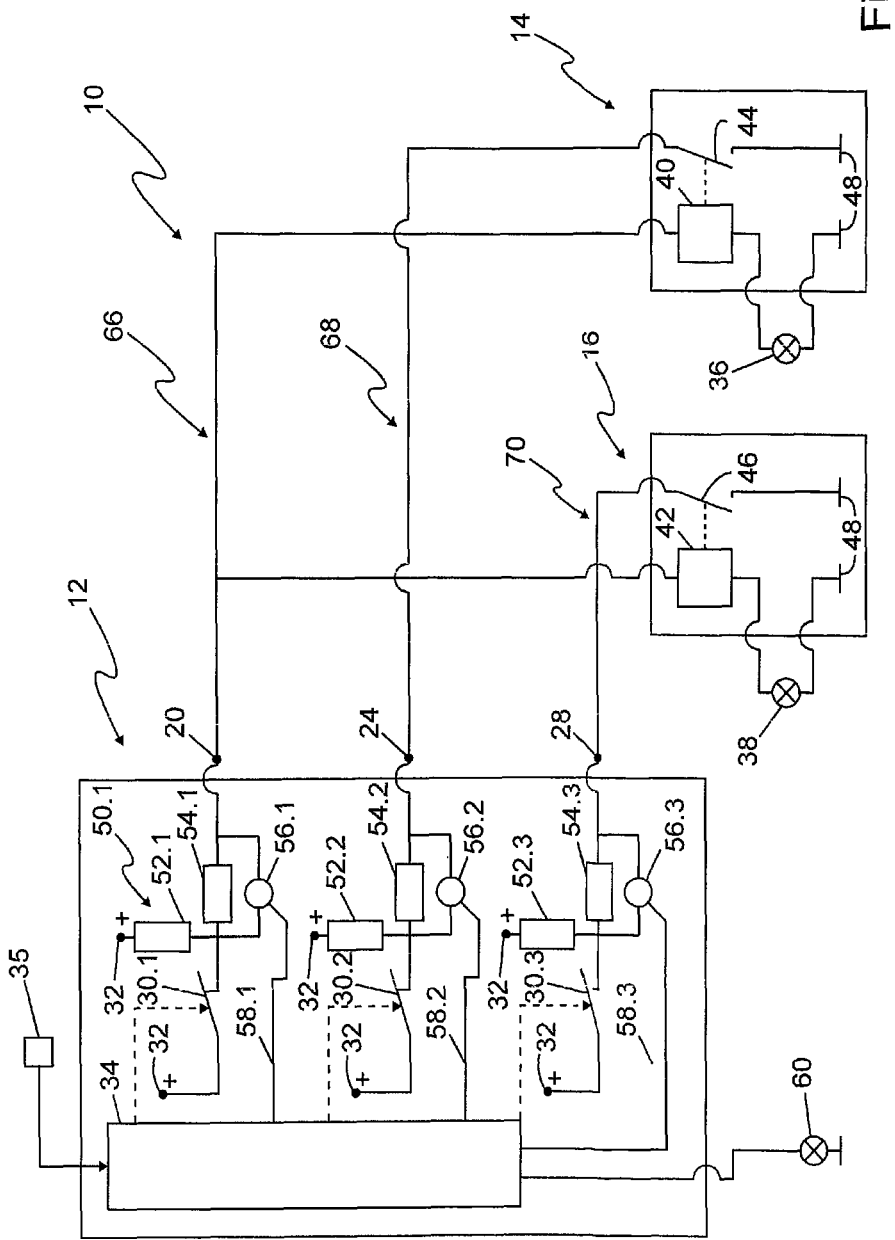
FIG. 2 shows in schematic form a second embodiment of the invention.

FIG. 2 shows an alternative embodiment in which the first light-control device 14 and second light-control device 16 are connected collectively via a supply line 66 to a first connection pin 20 of the power-supply control device 12. Furthermore, the first light-control device 14 is connected via its own error line 68 to a second connection pin 24 of the power-supply control device 12. The second light-control device 16 is also connected to a third connection 28 of the power-supply control device 12 via its own error line 70.

The two connections 24, 28 of the power-supply control device 12 are operated together with their associated high-side switches 30.2, 30.3 as well as their respective associated "open load" detection circuitries 50.2, 50.3 in such a manner as is described in conjunction with that of FIG. 1 for the third connection 28 and its associated high-side switch 30.3 as well as its associated "open load" detection circuitry 50.3.

The first connection pin 20 and its associated internal wiring (having the high-side switch 30.1. and the "open load" detection circuitry 50.1) are operated in such a manner as that described in conjunction with FIG. 1 for the two connection pins 20, 24 with their respective associated internal wiring (having high-side switches 30.1, 30.2 as well as "open load" detection circuitries 50.1, 50.2).

A difference between the subject matter of FIGS. 1 and 2 is obtained in that the separate error lines for the light-control devices 14, 16 in the subject matter of FIG. 2 enable a direct allocation of a detected malfunction to the respective light-control devices 14, 16 affected thereby such that successive activation and deactivation of the light-control devices 14, 16 for the further identification of the affected control device 14, 16 are not necessary.

The invention is explained in reference to a combination of a power-supply control device 12 and two light-control devices 14, 16. It is understood, however, that the invention is not limited to a combination containing two light-control devices 14, 16, but, instead, can be used with combinations having an arbitrary number (greater than or equal to one) of light-control devices 14, 16. At the same time, other appliances (such as sun-roof drives, power-window drives, and similar items) can be connected to other connection pins of the power-supply control device 12.

It should be appreciated that the invention has been described above in an illustrative manner. It should be so appreciated also that the terminology that has been used above is intended to be in the nature of words of description rather than of limitation. It should be so appreciated also that many modifications and variations of the invention are possible in light of the above teachings. It should be so appreciated also that, within the scope of the appended claims, the invention may be practiced other than as specifically described above.

What is claimed is:

1. A combination (10) comprising:
a power-supply control device (12) including a power distribution center in a motor vehicle that acts to control appliances in the motor vehicle having light sources and monitors their functions, said power distribution center further operable to be used with incandescent lamps or with semiconductor light sources, wherein the incandescent lamps and the semiconductor light sources having different properties; and
at least one electronic light-control unit (14) operating at least one semiconductor light source (36, 38), wherein said power-supply control device (12), and the appliances including the at least one electronic light-control unit (14) connected thereto are disposed in various locations in the motor vehicle and connected to one another via lines, wherein the power supply control device (12) supplies the electronic light-control unit (14) with power via a supply line (18) connected to a first connection pin (20) of said power-supply control device (12), monitors currents flowing through an additional connection pin of said power-supply control device (12), and makes use of diagnoses of an appliance connected to the additional connection pin, the electronic light-control unit (14) is connected to the additional connection pin (28) of said power-supply control device (12) via an error line (26) and checks the function of the connected semiconductor light source (36, 38) and, in the case of a malfunction, triggers a current flow in the error line (26), and said power-supply control device (12) reacts to the triggered current flow to generate an error message.

2. The combination (10) according to claim 1, wherein said at least one electronic light-control unit includes first and second electronic light-control units (14, 16), said electronic light-control units (14, 16) acting to control the semiconductor light sources (36, 38).

3. The combination (10) according to claim 2, wherein the electronic light-control units (14, 16) comprise a safeguarding and monitoring circuitry (40, 42) that detects malfunctions of the respective connected semiconductor light sources (36, 38) or ensures at least one of a temperature safeguarding or an electromagnetic compatibility or ensures a safeguard against a polarity reversal.

4. The combination (10) according to claim 3, wherein in the case of the malfunction, the safeguarding and monitoring circuitry (40) is adapted to engage a normally disengaged switch (44), and wherein when the switch (44) is engaged, the error line (26) is connected to a ground connection (48).

5. The combination (10) according to claim 4, wherein said first and second electronic-light-control units (14, 16) each include a ground connection (48) and a resistance of a current path, which lies between the ground connection (48) of said first electronic light-control unit (14) and a connection (62) of said second electronic light-control unit (16) at the error line (26), has a different value than a resistance of a current path lying between the ground connection (48) of said second electronic light-control unit (16) and the connection (62) of said second electronic light-control unit (16) at the error line (26).

6. The combination (10) according to claim 2, wherein the electronic light-control units (14, 16) are connected to the shared error line (26).

7. The combination (10) according to claim 2, wherein a control circuitry (34) of the power-supply control device (12) shuts off and again activates individually the electronic light-control units (14, 16) and is connected to the shared supply line (26) successively for a short period of time until the malfunctioning electronic light-control units (14, 16) are identified.

8. The combination (10) according to claim 2, wherein the power-supply control device (12) shuts off and again activates the electronic light-control units (14, 16) connected to the shared error line (26) successively such that only one of the light-control units (14, 16) is shut off at a time.

9. The combination (10) according to claim 2, wherein said first and second electronic light-control units (14, 16) are collectively connected via a shared supply line (66) to the first connection pin (20) of the power-supply control device (12), said first electronic light-control unit (14) is connected to a second connection pin (24) of the control device (12) via an error line (68), and said second electronic light-control unit (16) is connected to the additional connection pin (28) of the power-supply control device (12) via an error line (70).

10. The combination (10) according to claim 1, wherein the power-supply control device (12) is programmed to evaluate a current flow in the error line (26) as a malfunction of an appliance connected to said error line (26) and at least one of issue and store a corresponding error signal.

11. The combination (10) according to claim 1, wherein the power-supply control device (12) activates an error lamp (60) or transmits the error message to an infotainment system of the vehicle or stores the error message in a readable memory.

* * * * *